United States Patent [19]
Laber et al.

[11] Patent Number: 5,283,483
[45] Date of Patent: Feb. 1, 1994

[54] SLIMMER CIRCUIT TECHNIQUE

[75] Inventors: Carlos A. Laber, Los Altos; Paul R. Gray, Orinda, both of Calif.

[73] Assignee: Micro Linear Corporation, San Jose, Calif.

[21] Appl. No.: 9,886

[22] Filed: Jan. 27, 1993

[51] Int. Cl.$^5$ .............................................. H03K 17/16
[52] U.S. Cl. .................................... 307/520; 307/494; 307/267; 328/127; 328/162; 328/168
[58] Field of Search ............... 328/162, 167, 168, 127; 307/520, 494, 267; 333/28 R, 20, 166

[56] References Cited

FOREIGN PATENT DOCUMENTS 4-294627 10/1992 Japan ................................ 307/520

OTHER PUBLICATIONS

R. Castello, et al., "A Very Linear BiCMOS Transconductor for High-Frequency Filtering Applications", Proceedings of ISCAS 1990, pp. 1364-1367.

S. L. Wong, "Novel Drain-Biased Transconductance Building Blocks for Continuous-Time Filter Applications", Electronics Letters, vol. 25, No. 2, Jan. 1989, pp. 100-101.

G. A. DeVeirman, et al., "A 27 MHZ Programmable Bipolar 0.05° Equiripple Linear-Phase Lowpass Filter", ISSCC Digest of Technical Papers, Feb. 1992.

C. A. Laber, et al., "Design Considerations for a High--Performance 3 µm CMOS Analog Standard Cell Library", IEEE Journal of Solid-State Circuits, vol. SC-22, No. 2, pp. 181-189, Apr. 1987.

C. A. Laber and P. Gray, "A 20MHZ 6th Order BIC-MOS Programmable Filter Using Parasitic-Insensitive Integrators", Symposium on VLSI Circuits, Digest of Technical Papers, Seattle, Washington, Jun. 1992.

C. F. Chiou and R. Schaumann, "Design and Performance of a Fully Integrated Bipolar 10.7-MHz Analog Bandpass Filter", IEEE Journal of Solid-State Circuits, vol. SC-21, No. 1, pp. 6-14, Feb. 1986.

ML6006 Data Sheet, 36 Mbps Read Channel Filter/Equalizer, Micro Linear Corporation, San Jose, California, pp. 5-221-5-230, Jul. 1992.

Primary Examiner—Margaret R. Wambach
Attorney, Agent, or Firm—Haverstock, Medlen & Carroll

[57] ABSTRACT

A fast parasitic-insensitive continuous-time filter and equalizer integrated circuit that uses an active integrator is described. Circuit techniques for excess-phase cancellation, and for setting the corner-frequency of the filter and equalizer are also described. These techniques result in a filter and equalizer chip with performance independent of process, supply, and temperature without employing phase-lock loops. This 20MHz 6th order Bessel filter and 2nd order equalizer operate from 5V, and generate only 0.24% (−52 dB) of total harmonic distortion when processing 2 Vp−p differential output signals. The device is optimized to limit high-frequency noise and to amplitude equalize the data pulses in hard disk read-channel systems. The device supports data rates of up to 36 Mbps, and is built in a 1.5µ/4 GHz BiCMOS technology.

11 Claims, 14 Drawing Sheets

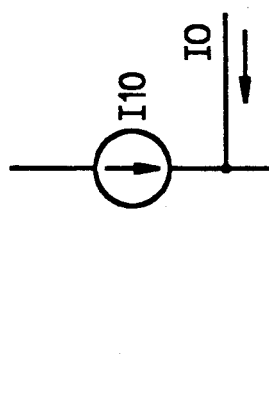
FIG. 1
(PRIOR ART)
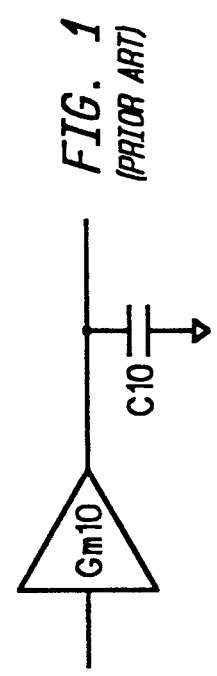
FIG. 2
(PRIOR ART)
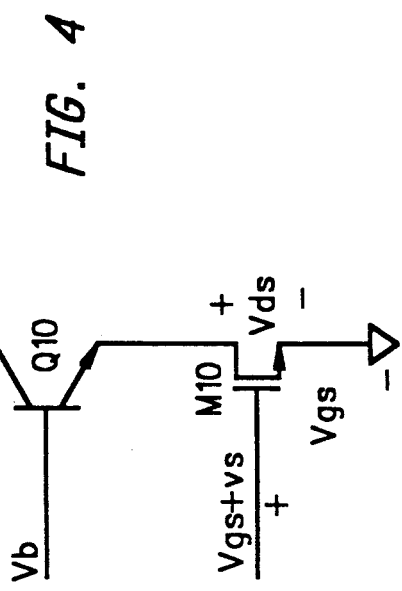
FIG. 4
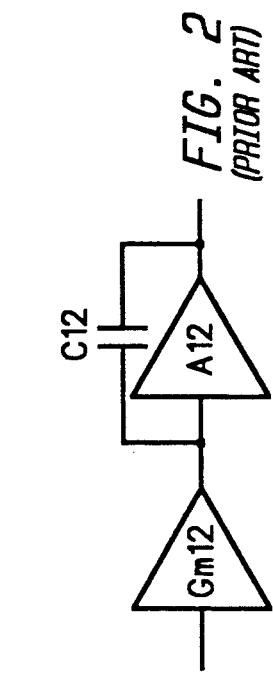
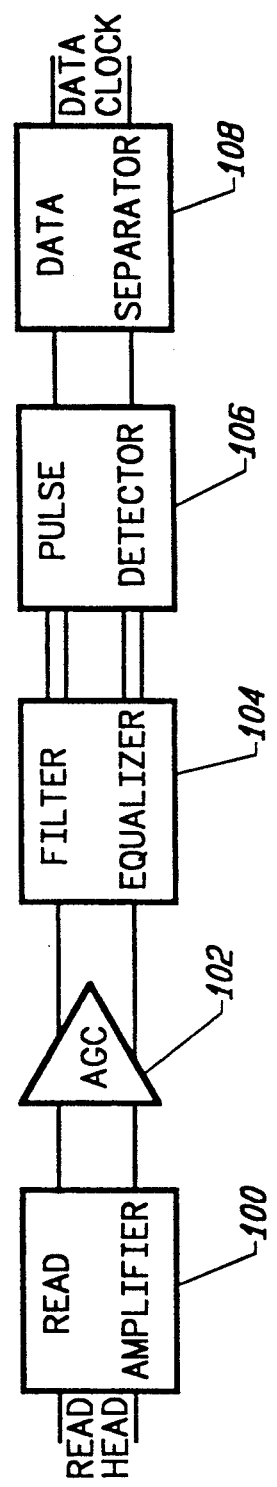
FIG. 3

SLIMMER CIRCUIT TECHNIQUE

FIELD OF THE INVENTION

This invention relates to the field of analog signal filters. More particularly, this invention relates to BiCMOS parasitic-insensitive continuous-time filter circuits for analog integrated circuits.

BACKGROUND OF THE INVENTION

High-frequency continuous-time filters have traditionally utilized a basic passive integrator consisting of a transconductance stage driving a passive integrating capacitor. In the frequency domain, an ideal integrator will have a phase shift of 90° because it takes 90° to process the integration. According to the Laplace transform $$L = \frac{1}{s} = J\Omega.$$

Thus, s equals a 90° phase shift. Unfortunately, practical circuits do not have a 90° phase shift.

When an integrator is used in a filter, one simulates an inductor and a capacitor developing resonance for filtering. The quality of the filter depends upon the amount of phase shift introduced by the circuit. It is desirable for an integrator circuit to be independent of temperature, supply voltage and process variations.

FIG. 1 conceptually illustrates this structure in simplified form. An analog signal is coupled to the input of a transconductance stage $G_{m10}$ which is coupled to a first terminal of an integrating capacitor C10. The other terminal of the capacitor C10 is coupled to ground. These approaches have been attractive for several reasons, among which are their simplicity, a generally smaller excess phase and power dissipation. These simpler passive integrators, however, are extremely susceptible to frequency response variations due to the parasitic capacitance associated with the parasitic-sensitive output nodes of the transconductance.

The total integrating capacitor C10 as shown in FIG. 1, comprises not only an extrinsic capacitor $C_1$, but also of intrinsic parasitic capacitance resulting from parasitic diodes, overlaps, crossings, strays, fringing effects and so on. All of these parasitics have highly uncontrollable values, and are difficult to characterize accurately. This makes the filter much more difficult to design and manufacture. One of the consequences is that the filter requires a significantly wider trimming range in order to accurately tune the corner frequency. In addition, some parasitics, such as semiconductor junctions, are voltage dependent, which not only makes the response sensitive to power supply variations, but also degrades the distortion performance.

Parasitic capacitances associated with devices and interconnects are a particularly serious problem in high-frequency filters, where the values of integrating capacitors are small and parasitics have values that are a significant fraction of the integrating capacitor. The use of high-speed buffers at the integrator outputs can alleviate the situation somewhat, but at the expense of higher power consumption, circuit complexity, and more importantly increased excess phase shift in the resonators.

Another problem is that single-stage parasitic-sensitive passive integrators often have low open-circuit voltage gain. This results in frequency response and gain deviations that limits the practical value of Q that can be implemented.

An amplifier based active parasitic-insensitive high-gain integrator is shown in FIG. 2. Notice that the signal current from the transconductance stage $G_{m12}$ is forced to flow through a capacitor C12 connected in the feedback loop of a high-gain high-speed amplifier A12. The high gain of this amplifier A12 in conjunction with its feedback loop makes the input of the amplifier behave as a virtual ground, thus preventing any signal current from flowing into, and charging the input parasitic capacitance of the amplifier circuit A12. This makes the corner frequency of this integrator insensitive to parasitic capacitance. In spite of this advantage, the use of this technique has generally been avoided in high-frequency filters because of the additional excess phase shift that the amplifier contributes. This excess phase shift is responsible for Q enhancements, and produces undesirable amplitude response and group-delay deviations. Therefore, in general, the design of practical high-frequency filters with accurate and reproducible responses, depends upon the availability of a parasitic-insensitive high-gain integrator, with negligible excess phase shift, and a well controlled unity-gain frequency.

What is needed is a continuous-time filter and an equalizer which avoids the tuning problems associated with parasitic capacitance and the excess phase shift of prior art approaches.

SUMMARY OF THE INVENTION

The preferred embodiment of the present invention is for a continuous-time filter and an equalizer based on a circuit built using a highly linear BiCMOS transconductor and a high-speed parasitic-insensitive amplifier-based active integrator. This circuit allows the implementation of filters whose response are insensitive to interconnect, junction-parasitics, and any other stray capacitance, and with a wide range of quality factors. A unique circuit approach to cancelling the excess phase contributed by the BiCMOS amplifier allows this filter to achieve reproducible responses with corner frequencies of up to 27MHz in a 1.5μ/4GHz BiCMOS process technology. In addition, this active integrator incorporates a novel technique for setting the $G_m$ value of the transconductor as a function of an external precision resistor. This technique, in conjunction with a poly-fuse wafer-sort trim technique that removes capacitor process tolerances, results in a filter with a frequency response independent of supply, temperature and process. Thus, this technique eliminates the need for an on-chip phase-lock loop (PLL) for tuning the filter frequency response. In addition, these circuits are highly linear, thus allowing processing of large full-swing signals. This avoids the noise performance degradation that results from input attenuators and output amplifiers, which are required in earlier filters to reduce the signal-level and maintain a low distortion level. Finally, experimental results are presented from an integrated circuit which implements a filter and an equalizer optimized for processing hard disk drive read channel signals.

BRIEF DESCRIPTION OF THE DRAWINGS

FIG. 1 is a block diagram of a prior art passive integrator.

FIG. 2 is a block diagram of a prior art active integrator.

FIG. 3 is a block diagram of a typical application implying the preferred embodiment of the present invention.

FIG. 4 is a simplified circuit schematic of a BiCMOS transconductor.

The circuitry for the excess phase cancellations are shown in FIGS. 5, 6, 7 and 8. FIG. 9 shows the transconductor of the present invention. FIG. 12 shows the slimmer circuit invention.

DETAILED DESCRIPTION OF THE PREFERRED EMBODIMENT

Figure 5:
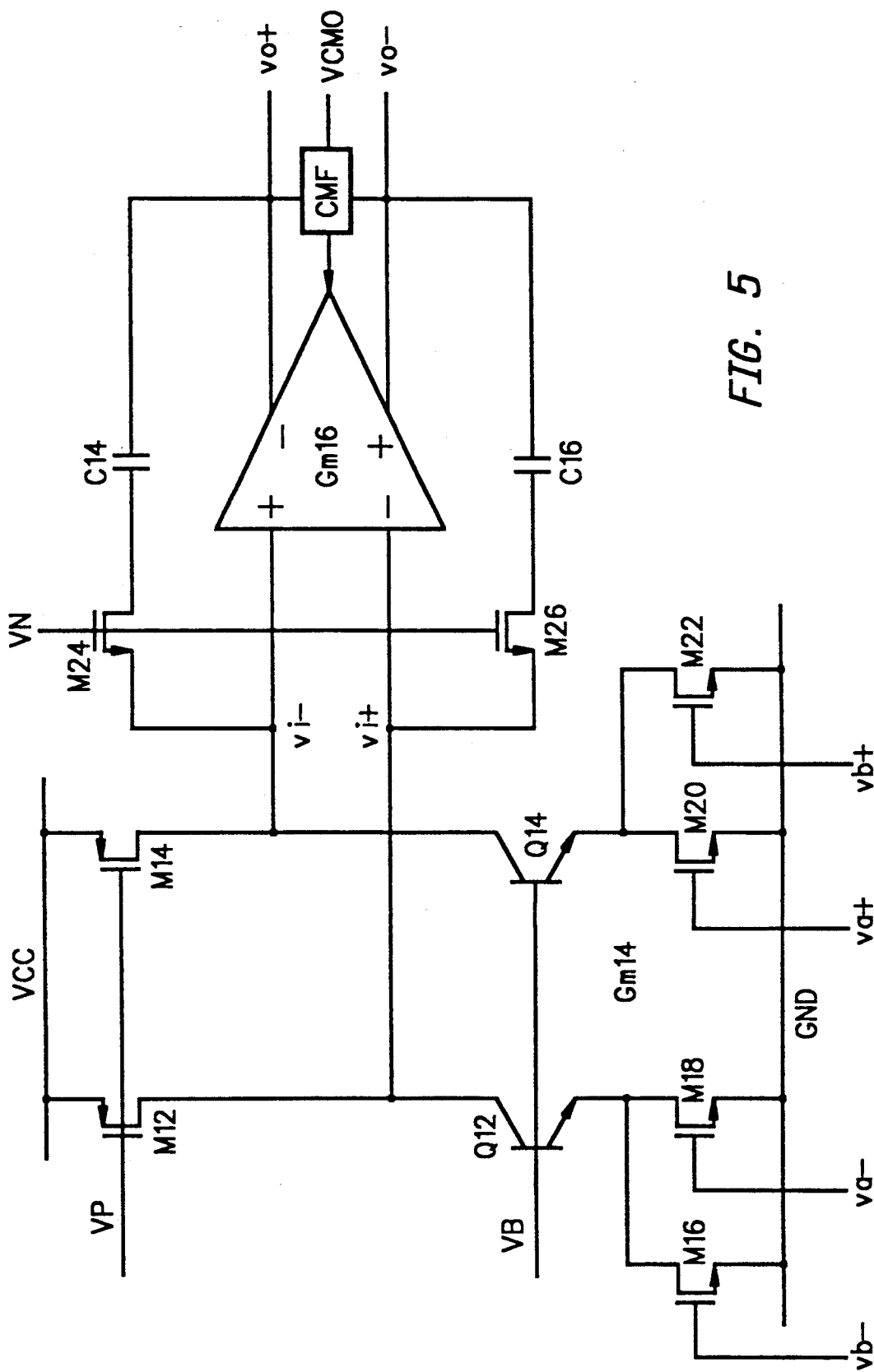
FIG. 5 is a circuit diagram of a two input differential BiCMOS active integrator according to the present invention.

One application for a circuit built according to the present invention is a hard disk drive read-channel. FIG. 3 shows a block diagram for a typical hard disk drive read-channel. The signal from a read head of a hard disk drive is coupled via two inputs to a read amplifier 100. The signal amplified by the read amplifier is coupled to the inputs of an automatic gain control circuit 102. The output of the automatic gain control circuit 102 is coupled to a filter equalizer circuit 104 whose output is in turn coupled to a pulse detector 106. The output of the pulse detector is coupled to a data separator 108 which coupled the data to other circuitry not shown and generates a clock signal for driving circuitry not shown. The signal, which is usually in the microvolt range, is first sensed by a magnetic read head and amplified by the fixed gain of the read amplifier 100. Next, the amplitude of the data pulses is further adjusted by an automatic gain control loop which adjusts the signal level between 1 and 2Vp−p measured differentially. This loop comprises the AGC amplifier 102 followed by the filter and equalizer 104, and the pulse detector 106.

Micro Linear Corporation of San Jose, California manufactures a circuit which implements both the filter and equalizer functions in a single integrated circuit. Those circuits bear the Micro Linear Corporation designations ML6004, ML6005, ML6006, ML6007, ML6008, ML6014, ML6015, ML6016, ML6017, ML6018, ML6024, ML6025, ML6026, ML6027 and ML6028. The various designations are used to distinguish between the speed achievable by the circuits.

The function of the filter is to limit the amount of high-frequency noise by providing a well-controlled lowpass characteristic. This increases the signal-to-noise ratio and improves the error-rate performance of the system.

The equalizer compensates for the uncontrolled lowpass characteristic of the channel, which causes intersymbol interference by providing a programmable and well-controlled high-frequency boost. This amplitude boost realizes a second-order approximation to a cosine-equalizer response with linear phase. The equalization allows an increased bit density on the disk, in turn allowing a higher storage capacity since pulses that are more closely spaced can be detected reliably. This cosine equalizer is also referred to as a slimmer circuit because it literally slims the pulses in the time domain.

The filter and equalizer integrated circuits provided by Micro Linear Corporation also incorporate a differentiator required for the pulse detection function, with group-delay characteristics matched to the main filter independent of the corner-frequency setting. The pulse detector issues a pulse of fixed duration at the time of the data transitions (signal peaks) by performing a zero-crossing operation on the differentiated output of the filter. This pulse train is then sent to the data-separator and decoder block, which then outputs the data and the clock to the controller.

Typically, most systems encode the data bits with an RLL (1,7 2/3) (run-length limited) code. This means that for a data rate of 36Mbps, reliable detection requires a linear-phase channel filter with a corner frequency of about 20MHz. The circuit of the preferred embodiment has a corner-frequency that can be programmed from 4.7 MHz to 20.3MHz, and a high-frequency boost equalization programmable from 0 to 10dB.

CIRCUIT DESCRIPTION

1. Transconductance.

FIG. 4 is a circuit diagram of a simplified single-ended schematic of the BiCMOS transconductor. The circuit includes of an N-channel MOS transistor M10 and a bipolar transistor Q10 biased by a current source 110. A power supply is coupled to a current source 110 which provides current to the collector of a bipolar NPN transistor Q10. The base of the bipolar transistor is coupled to receive a voltage signal. The emitter of the transistor Q10 is coupled to the drain of an N-channel MOS transistor M10. The gate of the transistor M10 is coupled to receive a signal. The source of the transistor M10 is coupled to ground.

The transistor M10 operates in the linear or triode region with a well-defined drain-source voltage Vds and gate-source voltage Vgs. The voltage Vds is set by the cascode bipolar transistor Q10, which also increases the output impedance of the transconductor. The signal is applied to the gate of the transistor M10 superimposed on the DC bias voltage Vgs. The base bias voltage of the transistor Q10 controls the value of the drain-source voltage Vds of the transistor M10 and thus its transconductance value, and is generated by the $G_m$-setting circuit described later. The value of the total or equivalent transconductance $G_m$ is given by:

$$G_M = \frac{io}{vs} \approx \frac{g_{mM10}}{1 + \frac{kT}{q \cdot Vds}} \quad (1)$$

where $$g_{mM10} = \mu C_{ox} \frac{W}{L} Vds \quad (2)$$

One important feature of this transconductor is its excellent linearity which results in a very low distortion level. Measured distortion levels on actual devices of the preferred embodiment is typically in the $-52dB$ range for full scale 2Vpp differential signals. This distortion is mostly due to variations in Vds produced by the finite $g_{mM10}$ of the transistor Q10. Lower distortion values are achievable through circuit techniques that reduce the effect of Vds variations at the expense of circuit bandwidth.

Another source of non-linearity is mobility modulation due to the vertical field produced by Vgs changes. Note that this non-linearity source only contributes a negligible distortion in the preferred embodiment. This inherently good transconductor performance allows the design of monolithic filters that can process relatively large signal levels while maintaining low distortion, thus achieving relatively good dynamic range and signal/noise ratio performance.

An important advantage of the transconductor of FIG. 4 is its high input impedance, and the very low capacitance loading that it presents to the source. In addition, the circuit achieves an excellent high-frequency behavior with very low excess phase.

2. Integrator. FIG. 5 is a circuit diagram of a two-input differential BiCMOS active integrator that is realized by connecting a two-input differential transconductor and an amplifier-based active capacitor. Notice that the output signal currents from both transconductors are added at the drains of the MOS devices. One advantage of this design, over one which adds the currents at the collectors of the bipolar transistors, is that it produces smaller distortion and phase shift. This is mainly because the gm of the bipolar cascode transistors is larger, due to the increase (double) in the current level.

A power supply VCC is coupled to the drain electrodes of two p-channel MOS transistors M12 and M14. The gates of transistors M12 and M14 are controlled by a voltage signal VP. The source of the transistor M12 is coupled to the negative input of a transconductance amplifier $G_{m16}$, the source n-channel MOS transistor M26 and to the collector of an NPN bipolar transistor Q12. The source of the transistor M14 is coupled to the positive input of the transconductor amplifier $G_{m16}$, the source of an n-channel MOS transistor M24 and to the collector of an NPN bipolar transistor Q14.

The gates of the transistors Q12 and Q14 are controlled by a voltage signal VB. The emitter of the transistor Q12 is coupled to the drains of two n-channel MOS transistors M16 and M18. The gate of the transistor M16 is controlled by a voltage signal vb— the gate of the transistor M18 is controlled by a voltage signal va— the sources of the transistors M16 and M18 are coupled to ground. The collector of the transistor Q14 is coupled to the drains of two n-channel MOS transistors M20 and M22.

The gate of the transistor M20 is controlled by a voltage signal va+ the gate. The gate of the transistor M22 is controlled by a voltage signal vb+. The sources of the transistors M20 and M22 are coupled to ground. The transistors M12, M14, Q12, Q14, M16, M18, M20 and M22 comprise a transconductor $G_{m14}$. The negative output of the transconductor $G_{m16}$ is coupled to the output vo+ and to a first terminal of a capacitor C12. The other terminal of the capacitor C12 is coupled to the drain of the transistor M24. The positive output of the transconductor $G_{m16}$ is coupled to the output vo. of the circuit and to a first terminal of a capacitor C16. The other terminal of the capacitor C16 is coupled to the drain of the transistor M26. The gates of the two transistors M24 and M26 are coupled to be controlled by the signal VN. A CMF unit is coupled between the outputs of the transconductor $G_{m16}$ and is coupled as an input to the transconductor. It is coupled to be controlled by the signal VCMO.

The active-capacitor integrator consists of a high-speed high-gain transconductance amplifier and two capacitors, C12 and C16 in the feedback loops. The transistors M24 and M26 are coupled in series with the capacitors, respectively, and operate in the triode region to perform excess-phase cancellation. This integrator is characterized by a time constant $\tau 1$ which is given by:

$$\tau_1 = \frac{C14}{G_{m16}} \quad (3)$$

Notice that $\tau 1$ is only a function of the external capacitors C14 and C16, and is not sensitive to any parasitic capacitance either at the input of the amplifier, which is kept at virtual ground by the amplifier, or at the output of the integrator which is driven by the amplifier.

This circuit requires an input common-mode feedback loop, which is not shown for simplicity, to set the operating bias voltage at the input of the transconductor $C_{m16}$. This also sets the bias of M24 and M26 and increases the input common-mode rejection of the integrator. An output common-mode feedback circuit CMF sets the transconductor $C_{m16}$ output bias voltage to a precise value VCMO. This voltage must accommodate the maximum signal swing at the transconductor $G_{m16}$ output, and, at the same time bias, the transconductor $C_{m14}$ input properly to maintain triode-region operation over the full temperature range. This requirement stems from the fact that in most filters these integrators are connected in differential feedback loops, which forces a direct connection between the transconductor $G_{m16}$ outputs and the transconductor $G_{m14}$ inputs. Also, since the output common-mode feedback reduces the common-mode output signals by providing a low common-mode output impedance, the amount of common-mode signals at the transconductor $G_{m14}$ input is also reduced.

Figure 6:
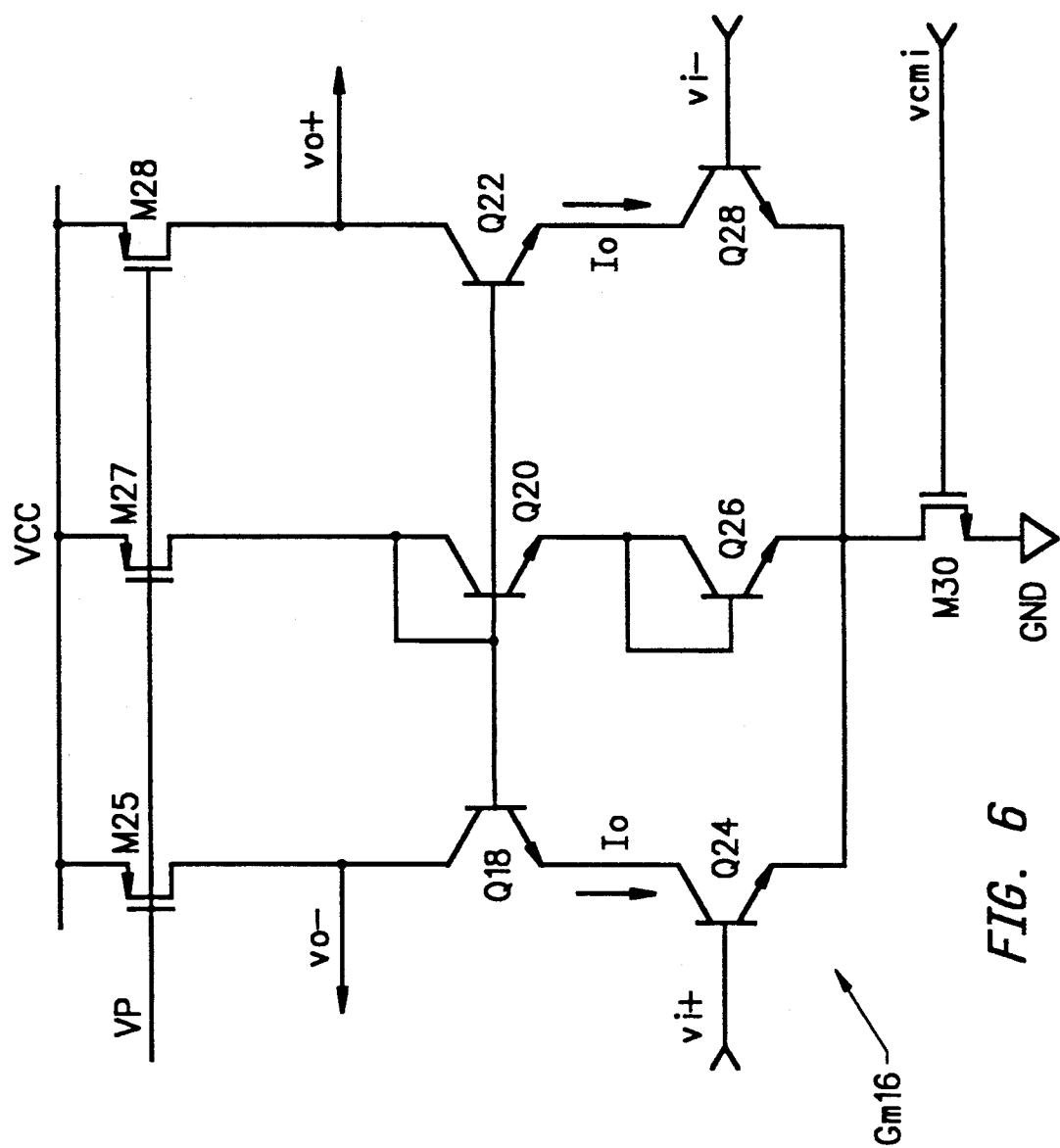
FIG. 6 shows a simplified schematic of the transconductor of FIG. 5.

FIG. 6 shows the simplified schematic of the transconductor $G_{m16}$. The transconductor $C_{m16}$ is a differential transconductance BiCMOS high-speed amplifier. The drains of three p-channel MOS transistors M25, M27 and M28, respectively, are all coupled to the power supply Vcc. The gates of the transistors M25, M27 and M28 are controlled by a voltage signal VP.

The drain of the transistor M27 is coupled to the negative output of the transconductor $G_{m16}$ (FIG. 5) vo− and to the collector of an NPN bipolar transistor Q18. The source of the transistor M26 is coupled to the collector and base of an NPN bipolar transistor Q20. The source of the transistor M28 is coupled to the positive output of the transconductor $G_{m16}$ (FIG. 5) po+ and to the collector of an NPN bipolar transistor Q22. The bases of the three transistors Q18, Q20 and Q22 are all coupled together. The emitter of the transistor Q18 is coupled to the collector of an NPN bipolar transistor Q24. The base of the transistor Q24 is coupled to be controlled by the voltage signal vi−. The emitter of the transistor Q20 is coupled to the collector and the base of an NPN bipolar transistor Q26. The emitter of the transistor Q22 is coupled to the collector of an NPN bipolar transistor Q28. The base of the transistor is coupled to be controlled by a voltage signal vi−. The emitters of the three transistors Q24, Q26 and Q28 are all coupled to the drain of an n-channel MOS transistor M30. The gate of the transistor M30 is coupled to be controlled the voltage signal vcmi. The source of the transistor M30 is coupled to ground.

The transistors M24 and M26 (FIG. 5) essentially are biased to operate as resistors in the feedback loop to cancel phase shift of the circuit. The transistors Q24 and Q28 are a primary source of phase shift. This would not be a problem with infinite transconductance of these transistors Q24 and Q28. The circuit is designed to match the transconductance of the transistors Q24 and Q28 to the resistive impedance of the feedback transistors M24 and M26.

The circuit has bipolar input common-emitter drivers Q18 and Q22 biased by the P-channel MOS transistors M25 and M28 which are configured as current sources. These devices not only increase the amplifier DC gain by raising the output impedance, but also prevent the base-collector capacitance of the transistors Q24 and Q28 from affecting the integrating time-constant $\tau_1$.

The output common-mode feedback loop is closed through the transistor M30, and it is referred to ground for improved PSRR (power supply rejection ratio). The small-signal Vo gain of the integrator that results from this transconductor $G_{m16}$ amplifier is given by:

$$A_0 = G_m \beta r_o \quad (4)$$

3. Transconductor $G_{m16}$ Amplifier bias. The compensation of excess phase effects in the transconductor $G_{m16}$ requires precise control of the temperature and device dependence of the transconductor $G_{m16}$ bias current, as explained below. The first non dominant pole of the amplifier-based integrator is related to the transconductance gm of the bipolar input transistors Q18 and Q22. The location of the cancelling zero is related to the on resistance of the transistors M24 and M26 (FIG. 5). Thus, the key objective to achieve phase cancellation is to cause the small signal transconductance gm of the input bipolar devices to track the MOS process and temperature behavior of the small signal triode region drain to source conductance gds of the transistors M24 and M26 (FIG. 5).

Figure 7:
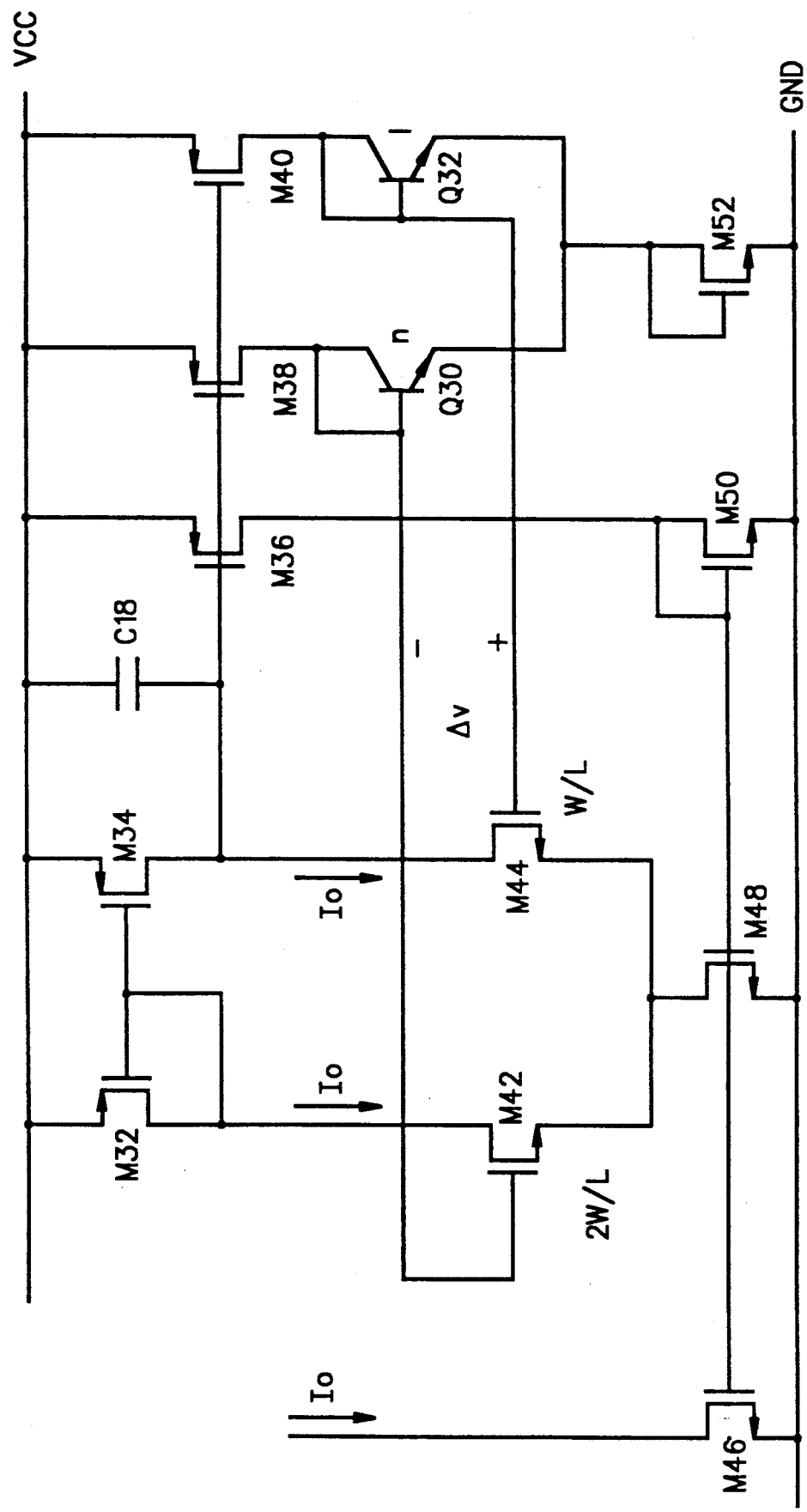
FIG. 7 shows a circuit for generating the bias current $I_o$ of FIG. 6.

FIG. 7 shows the circuit that is used to generate the bias current of the amplifier. The drain of two p-channel MOS transistors M32 and M34 are coupled to the positive voltage supply VCC. The gates of the transistors M32 and M34 are coupled together, to the source of the transistor M32 and to the drain of an n channel MOS transistor M42. The drains of three p-channel MOS transistors M36, M38 and M40 are also coupled to the power supply VCC. The first terminal of a capacitor C18 is coupled to a power supply VCC. The second terminal of the capacitor C18 is coupled to the source of the transistor M32, to the gates of the transistors M36, M38 and M40 and to the drain of an n-channel MOS transistor M44. The source of the transistor M36 is coupled to the drain and the gate of an n-channel MOS transistor M50. The source of the transistor M38 is coupled to the collector and the base of an NPN bipolar transistor Q30 and to the gate of the transistor M42. The source of the transistor M40 is coupled to the collector and the base of an NPN bipolar transistor Q32 and to the gate of the transistor M44. The emitters of both the transistors Q30 and Q32 are coupled to the drain and the gate of an n-channel MOS transistor M52. The sources of the transistors M42 and M44 are coupled to the drain of an n-channel MOS transistor M48. The gates of the transistors M50 and M48 are coupled together and to the gate of an n-channel MOS transistor M46. The sources of the transistors M46, M48, M50 and M52 are all coupled to ground. The drain of the transistor M46 is coupled to current source circuitry not shown.

The two bipolar transistors Q30 and Q32 are designed to have a ratio of n:1, respectively, between the area of their emitter regions.

A primary function of the circuit of FIG. 7 is to generate a voltage difference $\Delta v$ as the difference in Vbe voltages between two bipolar devices with an emitter area ratio equal to n. This voltage, which is PTAT (proportional to absolute temperature) is then forced to match the offset voltage at the input of a MOS differential amplifier with an unbalanced aspect-ratio. This is achieved by enclosing it in a feedback loop connected with unity gain, which generates the desired output current. The PTAT voltage is produced by Q30 and Q32 conducting the same current given by M38 and M40, respectively, and is given by:

$$\Delta v = \frac{kT}{q} \ln(n) \quad (5)$$

Transistor M52 increases the common mode voltage for proper biasing of the MOS differential pair M42 and M44. This pair is made such that the width of M42 is twice the width of M44 providing twice the current carrying capability. In addition, M32, M34 and the feedback loop through M36–M48 bias M42 and M44 to conduct the same current $I_0$. This forces M44 to require a larger Vgs than M42, and it is this difference in Vgs between M42 and M44 that is equal to $\Delta v$ as given in equation (5). Then, it can be shown that the current produced by this circuit is given by:

$$I_0 = \frac{\mu_n C_{ox}}{2} \left[\frac{W}{L}\right] \left[\frac{\left(\frac{kT}{q}\right)}{\left(1 - \frac{1}{\sqrt{2}}\right)} \ln n\right]^2 \quad (6)$$

from which it follows:

$$I_0 \approx \mu_n C_{ox} T^2 \quad (7)$$

This means that the small signal transconductance gm of the amplifier input bipolar devices is given by the following proportionality:

$$g_m \approx \mu_n C_{ox} T \qquad (8)$$

Notice that if one assumes a typical temperature behavior for $\mu n$ of $T^{-3/2}$ the current $I_o$ has a temperature dependency of $$\sqrt{T}.$$

ThiS is a self-biased circuit which requires a start-up circuit in order to avoid the zero-current state. The start-up circuit is not shown for simplicity. The zero-current state is avoided by forcing a small amount of current to flow between the gate of transistor M36, where the compensation capacitor C18 is connected and ground. Current is thus forced through the transistors M36, M48 and M50, and the input state, and activates the feedback loop which then converges to the current given in Equation (6). After current is detected in the transistor M50, the start-up circuit is disabled for normal operation. It should be pointed out that the current $I_0$ is insensitive to gamma due to the common-source connection of M48 and M52.

Figure 8:
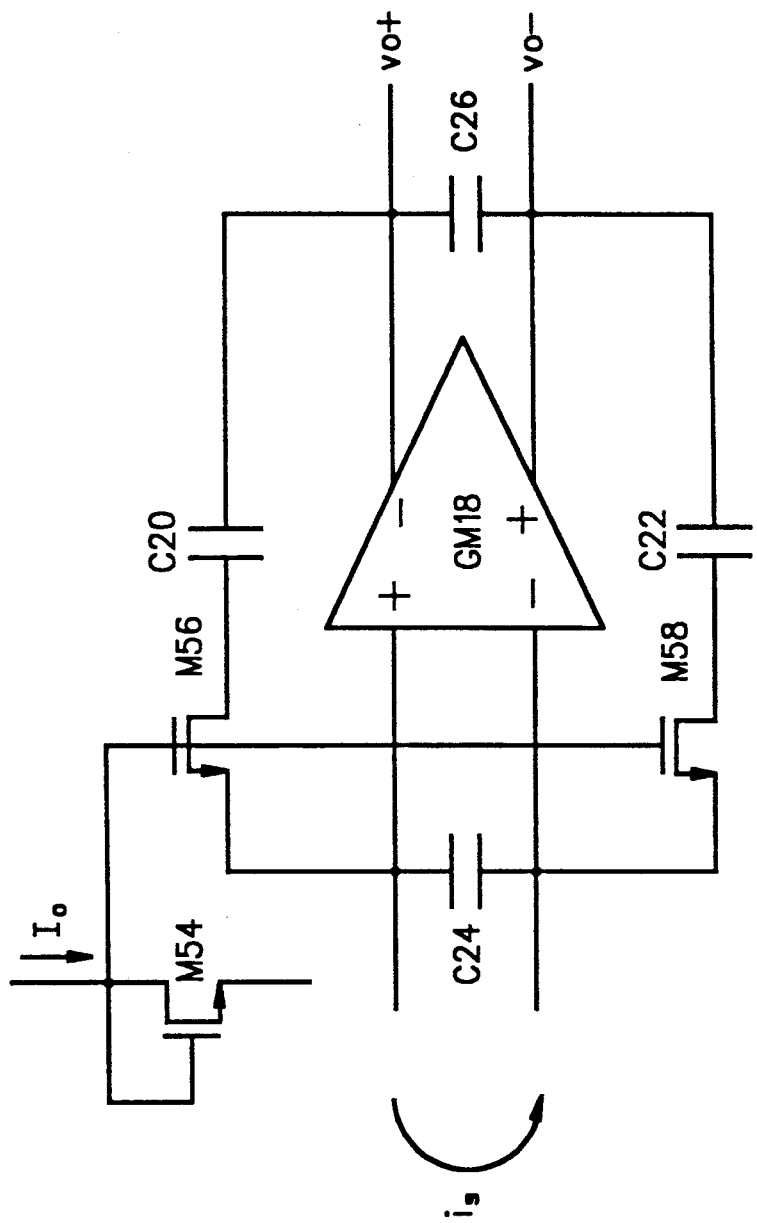
FIG. 8 shows a simplified schematic diagram of a differential active capacitor integrator.

4. Excess-phase cancellation. FIG. 8 shows a simplified schematic of the differential active capacitor integrator with excess-phase cancellation. An input current $I_0$ is coupled to the drain of an n-channel MOS transistor M54. The drain of the transistor M54 is coupled to its gate and to the gate of two n channel MOS transistors M56 and M58. The source of the transistor M54 is coupled to circuitry not shown. The source of the transistor M56 is coupled to the positive input of a transconductor $G_{m18}$. The source of the transistor M58 is coupled to the negative input of the transconductor $G_{m18}$. The input parasitic capacitance is represented in the circuit as transistor C24 coupled across the positive and negative inputs of the transconductor $G_{m18}$. The signal current produced by the transconductor flows differentially and it is represented by $i_s$. The drain of the transistor M56 is coupled to one terminal of a feedback capacitor C20. The other terminal of the capacitor C20 is coupled to the negative output of transconductor $G_{m18}$ and to the output vo+ of the circuit. The drain of the transistor M58 is coupled to a terminal of a feedback capacitor C22. The other terminal of the capacitor C22 is coupled to the positive output of the transconductor $G_{m18}$ and to the output vo. of the circuit. The parasitic output capacitance of the transconductor $G_{m18}$ is represented by the capacitor C26.

The capacitors C24 and C26 represent the total parasitic capacitance associated with the input and the output of the amplifier, respectively. The amplifier is characterized by the effective transconductance $G_{m18}$ of the input stage.

By way of analysis, assume first that M56 and M58 are shorted. Then, the frequency response shows a right-half plane zero due to the feed forward effect of C20, and a pole with a time constant given by:

$$\tau_2 = \frac{\left( C24 + C26 + \frac{C24 \, C26}{C20} \right)}{G_{m18}} = \frac{C_x}{G_{m18}} \qquad (9)$$

(Note that the feedback capacitors are equal in the preferred embodiment.) This pole produced by the amplifier the source of excess phase, which has a detrimental effect on the integrator and filter performance at high frequency. In order to extend this limited frequency range by means of the source-drain small signal conductance $g_{ds}$ of the transistors M56 and M58, which are biased by the transistor M54 and $I_0$. Then zero has a time constant:

$$\tau_z = \left[ \frac{C20}{g_{ds}} \right]\left[ 1 - \frac{g_{ds}}{G_{m18}} \right] \qquad (10)$$

The goal of this phase cancellation scheme is to make $T_z$ track the process, temperature and supply variations of $T_2$, by using replica concepts, so that first-order cancellation can be achieved. Thus, the relative pole-zero location is:

$$\frac{\tau_z}{\tau_2} = \left[ \frac{C20}{C_x} \right]\left[ \frac{G_{m18}}{g_{ds}} - 1 \right] \qquad (11)$$

The transistors M56 and M58 operate in the triode region with a gate-source voltage provided by M54 biased in saturation while conducting $I_0$. Also, the input common-mode feedback forces all three transistors M54, M56 and M58 to have the same threshold voltage, and operate with the same (Vgs−Vth). If the bias current in M54 is given by Equation (6), and, thus, has the same dependence on $\mu_n C_{ox} T^2$ as the bias current of the amplifier, then, it follows the proportionality (Vgs−Vth)≈T, from which it follows for M56 and M58 another proportionality $g_{ds} \approx \mu_n C_{ox} T$ (12). Thus, by replacing Equations (12) and (8) with Equation (11), it can be concluded that the circuit can be controlled to operate within a desired range by adjusting poly-fuse trim elements to adjust for process variations. By employing ground-referred biasing, the relative pole-zero location given in Equation (11) becomes independent of process, temperature, and supply.

The phase-shift contribution from all the other high-frequency poles and zeroes are adjusted by slightly changing the value of $\tau_z$ during wafer-sort trimming. The temperature behavior of these poles and zeroes may not track exactly as above; however, this deviation is very small and negligible here, and would probably be much more important in resonators with much higher quality factors.

In summary, the most important feature of this amplifier is that the $g_m$ of Q24 and Q28 (FIG. 6) are made proportional to the $\mu_n C_{ox}$ of the N-channel MOS transistors. This design implementation is the key that produces a temperature and device independent excess-phase cancellation circuit. This circuit is based upon biasing the amplifier using circuitry described above with a current $I_2$ given by the following proportionality:

$$I_2 \approx \mu_n C_{ox} T^2 \qquad (13)$$

which then results in the following proportionality:

$$g_{m8} \approx \mu_n C_{ox} T \qquad (14)$$

5. Corner frequency setting. An important problem that need to be resolved when designing continuous-time filters is setting and stabilizing the corner-frequency with respect to variations in supply, temperature, and process. Some implementations rely on control-loops and an external clock to set the value of $G_m/C$. However, the problem of clock-feedthrough and start-up make this circuit difficult to manufacture. Another approach makes use of the PTAT behavior of some transconductors, and relies on a PTAT current source and an external resistor to set the value of $G_m$. However, this scheme is only applicable to certain types of transconductors and in those cases where the PTAT behavior is highly predictable. The technique presented here is less restrictive and general enough that it can be applied regardless of the transconductor, as long as it is tunable. The circuit, shown in FIG. 9, basically applies a known voltage and a known current to a replica differential transconductor in a feedback loop and lets the loop define the $G_m$ as the ratio of the above known current and the known voltage. To increase the precision of this technique, an external resistor is used so that the $G_m$ ratio is exactly inversely proportional to the external Rext.

The four transistors M60, M62, M64 and M66 are all p-channel MOS transistors. The drain of the four transistors M60, M62, M64 and M66 are each coupled to a positive power supply vcc. The gate of the transistor M60 is coupled to its source, to the gate of the transistor M62 and to the drain of an n-channel MOS transistor M68. The gate of the transistor M68 is coupled to be controlled by the output of an amplifier circuit A14. The source of the transistor M68 is coupled to one input of the amplifier A14 and to a first terminal of a resistor R10. The other terminal of the resistor R10 is coupled to ground. The source of the transistor M62 is coupled to a first terminal of a resistor R12 and to control the gate of an n-channel MOS transistor M74. The second terminal of the resistor R12 is coupled to a first terminal of a resistor R14 and to the input of an amplifier circuit A16. A second input of the amplifier A16 is coupled to receive the voltage signal VCMO (FIG. 5). The other terminal of the resistor R14 is coupled to control the gate of an n-channel MOS transistor M72 and to the drain of an n-channel MOS transistor M70. In the preferred embodiment of the present invention, the value of resistor R12 is the same as R14 and are each ½ the value of the resistance of the resistor R10. The output of the amplifier A16 is couple to control the gate of the transistor M70. The source of the transistor M70 is coupled to ground. The current source 112 has a first terminal coupled to the positive voltage supply vcc for providing the current $\Delta i$. The second terminal of the current source 112 is coupled to a second input of the amplifier A14 and to an external resistor Rext. The other terminal of the external resistor Rext is coupled to ground.

Figure 9:
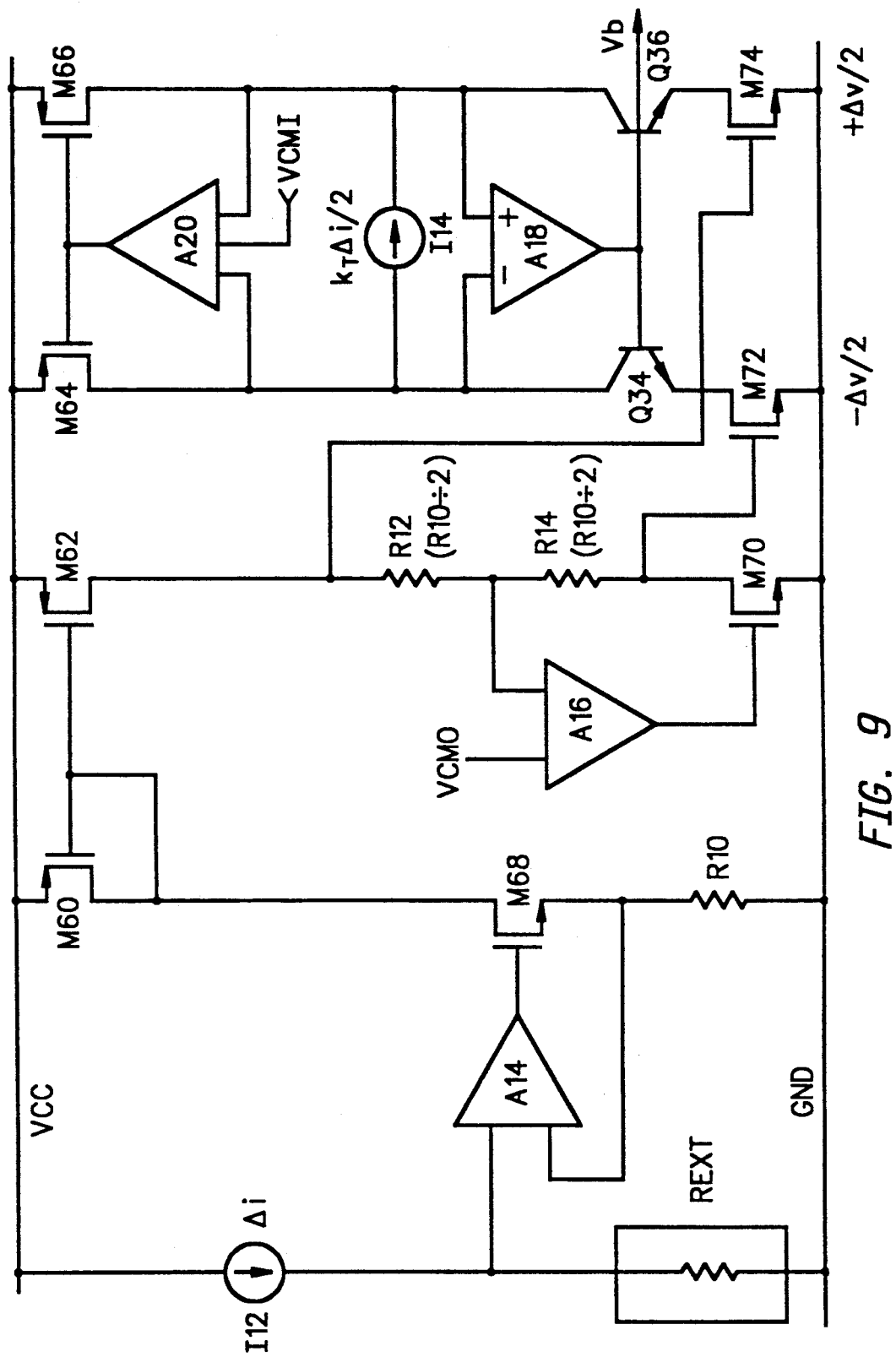
FIG. 9 shows a circuit for generating a control voltage Vb of FIG. 5.

The output of an amplifier A20 is coupled to control the gates of the transistors M64 and M66. The source of the transistor M64 is coupled to the first input of the amplifier A20 to one terminal of a current source I14, a negative input of an amplifier A18 and the collector of an NPN bipolar transistor Q34. The source of the transistor M66 is coupled to a second input of the amplifier A20, to the second terminal of the current 114, to the positive input of the amplifier A18 and to the collector NPN bipolar transistor Q36. The output of the amplifier A18 is coupled to control the basis of the transistors Q34 and Q36 and to provide a voltage signal Vb. The emitter of the transistor Q34 is coupled to the drain of the transistor M72. The emitter of the transistor Q36 is coupled to the drain of the transistor M74. The source of the two transistors M72 and M74 are coupled to ground. A voltage signal input VCMI is coupled to a third input of the amplifier A20. The current source 114 supplies a current $k_p\Delta i/2$. FIG. 9 shows the detail of the implementation where M72, M74, Q34 and Q36 make up the replica transconductor and A18 closes the differential feedback loop which defines the output control voltage Vb for all the other transconductors. This replica circuit is biased by current sources the transistors M64, M66 and common-mode amplifier A20, which also set the output common-mode voltage VCMI. The differential output current is forced by a current source 114 of value $k_T\Delta i/2$. The differential input voltage is generated by first forcing $\Delta i$ to flow through the external resistor Rext. This defines a voltage which is converted into current by the amplifier A14, the transistor M68 and the resistor R10, and mirrored by the transistors M60 and M62. Then, this current flows through two resistors R12 and R14 forming the differential value of the input voltage. The common-mode value is set to VCMO by a local feedback provided by the transistor M70 and the amplifier A16. Thus, the value of the transconductance becomes:

$$G_m = \frac{k_T \frac{\Delta i}{2}}{\frac{\Delta v}{2}} = \frac{k_T}{Rext} \quad (15)$$

This means that the corner frequency of the filter becomes: In the above equations, $k_T$ is simply a constant that is $$\omega_0 = \frac{G_m}{C_i} = \frac{k_t}{Rext\, C_i} \quad (16)$$

adjusted by a poly-fuse wafer-sort trim technique in order to remove the capacitor value tolerance with the end result that the corner frequency of the filter becomes independent of supply, temperature and process.

FILTER AND EQUALIZER

Figure 10:
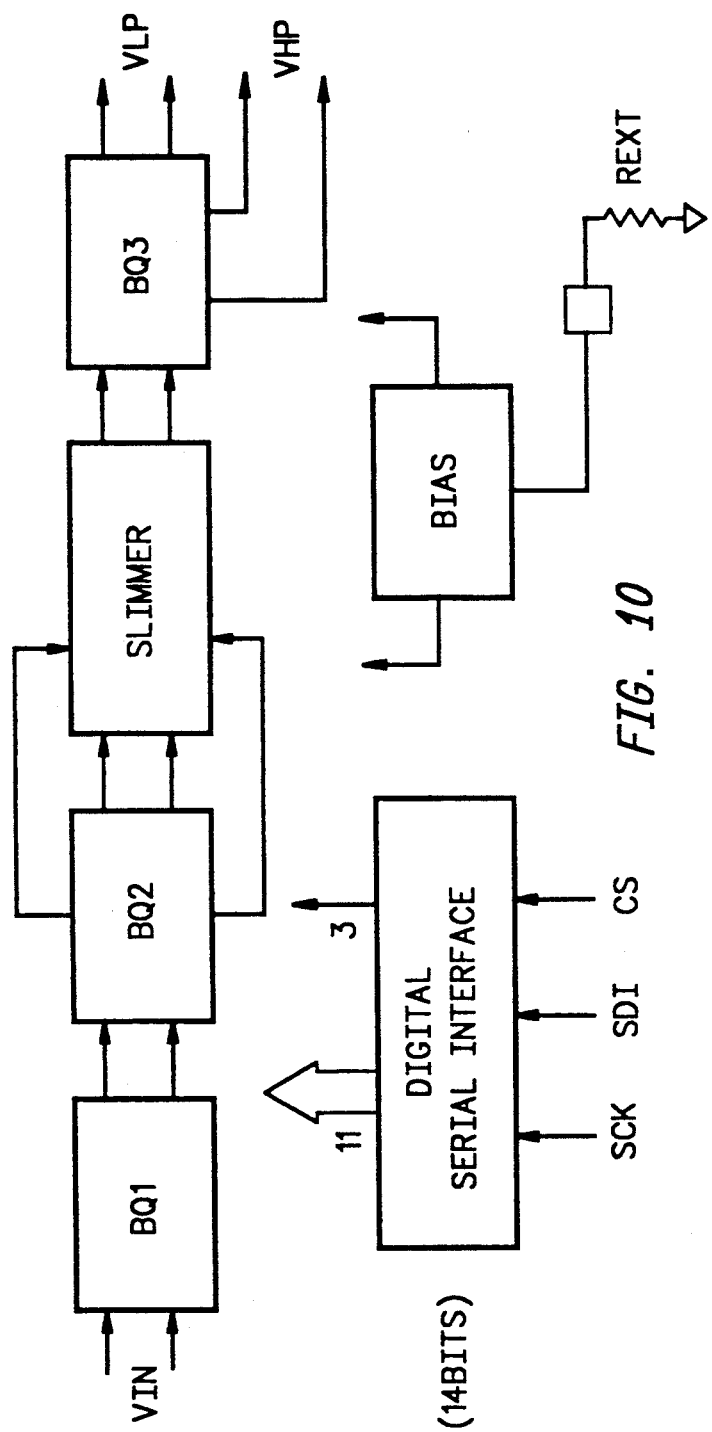
FIG. 10 shows a block diagram of the filter and equalizer of the preferred embodiment.

1. Description. FIG. 10 shows a block diagram of the filter and equalizer integrated circuit of the preferred embodiment. The circuit comprises a $6^{th}$ order Bessel lowpass filter that improves the error-rate performance of the channel by reducing the high-frequency noise generated primarily by the media and the read-amplifier. This filter provides a linear-phase response so that the symmetry of the data pulses is not affected.

The block diagram of the circuit of FIG. 10 has two voltage input lines vin coupled to the input of a fully hyphened differential biquadratic section BQ1. The biquadratic section BQ1 has two outputs coupled to the inputs of a second fully hyphened differential biquadratic section BQ2. The biquadratic BQ2 has four outputs each coupled to four inputs of a slimmer section. The slimmer has two outputs coupled to the two inputs of a third fully hyphened differential biquadratic section BQ3. The biquadratic section BQ3 has two pairs of voltage outputs VLP (a lowpass filter voltage output) and VHP (a highpass filter voltage output). FIG. 10 also shows a block diagram for a fourteen bit Digital Serial Interface having three inputs SCK, SDI and CS. The Digital Serial Interface includes an eleven bit output bus and a three bit controller bus. Additionally, a block diagram is shown for a bias circuit coupled for setting the bias by the resistor Rext. The bias circuit has two outputs.

The filter includes three fully-differential biquadratic sections, each of which provides two output, a bandpass and a lowpass response. The bandpass outputs from two of the sections, BQ2 and BQ3, are also used to implement the slimmer function and the output differentiator. Equalization is provided by the slimmer circuit. The name slimmer refers to the fact that the data pulses actually get thinner in the time-domain as they get processed by this circuit. The slimmer response is a second-order approximation of a cosine equalizer, which is a simpler implementation (3-tap with equal and negative first and third coefficients) of a fractionally-spaced ($\tau$) linear transversal equalizer. This circuit provides a high-frequency boost with linear-phase to cancel inter-symbol interference. The amount of boost is digitally programmable and is equivalent to changing the value of $\tau$ (tap delay) of the transversal equalizer. This equalizer provides 32 different slimming levels, which are controlled by 5 bits from the serial interface. Also, this interface allows 6 bits of digital control of the corner frequency of the filter, which results in 64 different frequencies over a 4.3 to 1 range between 4.7 to 20.3 MHz. A total of 2048 different responses are available from the circuit of the preferred embodiment.

The bias-block shown in FIG. 10 provides all the biasing for the entire integrated circuit, including the setting of the corner-frequency. This frequency, as described above, is set by an external resistor and is digitally controlled by programming the integrating capacitors. The two outputs of the last biquadratic section are buffered and brought out of the integrated circuit as the lowpass and differential output signals. This is a very effective technique for providing a differentiated output that tracks the corner-frequency of the lowpass response and provides excellent group-delay matching performance.

The serial interface provides an easy three-wire interface to a controller. In addition to configuring the frequency response of the filter and the equalizer, the circuit can be powered down through software to reduce power dissipation and the input to the filter can be clamped during write mode to allow fast recovery and prevent noise feedthrough. Another feature enabled through the interface is an auto-zero function that minimizes the DC offset at both outputs to allow the filter to couple directly to the pulse detector circuit without AC coupling capacitors.

The following section describes the second-order filter stage; the subsequent section discusses the implementation of the equalizer.

Figure 11:
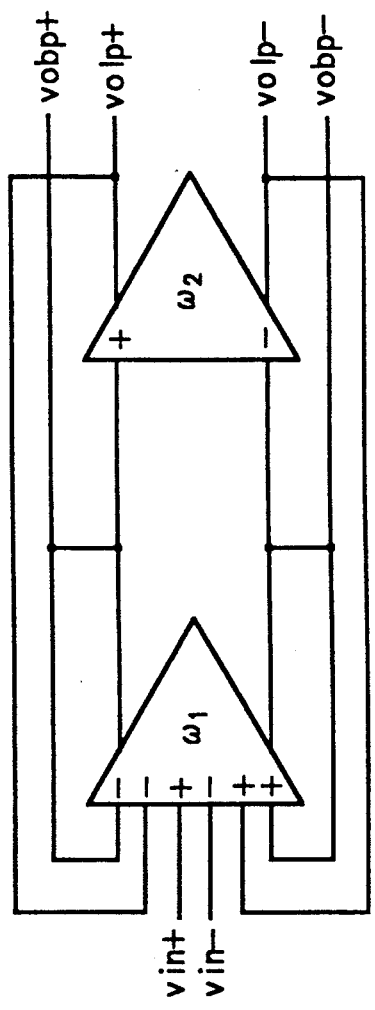
FIG. 11 shows a more detailed circuit diagram for forming the second-order resonators of FIG. 10.

2. Biquadratic stage. This second-order resonator is realized, as shown in FIG. 11, by connecting two integrators in a feedback loop, and by defining the quality factor Q through the loop around the first integrator. A first integrator $\omega_1$ has six inputs, three negative and three positive. Positive voltage input vin+ is coupled to a first positive input. A negative voltage input vin. is coupled to first negative input. The first integrator $\omega_1$ has two outputs. A first output of the first integrator $\omega_1$ is coupled to a positive input of a second integrator $\omega_2$, to a positive voltage output vobp+ and as a feedback signal to a second negative input of the integrated $\omega_1$. A second output of the integrator $\omega_1$ is coupled to a negative input of the integrator $\omega_2$, to a negative output vobp− and as a feedback signal to a second positive input of the integrator $\omega_1$. The integrator $\omega_2$ has two outputs. A first output is coupled to a positive output signal volp+ and as feedback signal to a third negative input of the integrator $\omega_1$. The second output of the integrator $\omega_2$ is coupled to a negative output signal volp. and as a feedback signal to positive input of the integrator $\omega_1$. This circuit includes two outputs: a lowpass output volp having a positive and a negative signal terminal volp+ and volp−, respectively, and a bandpass output vobp having a positive and negative signal terminal vobp+ and vobp−, respectively. Notice that since the output of the second integrator volp is obtained by pure integration of vobp, vobp is thus the differentiated version of volp. The lowpass and bandpass transfer functions are given by:

$$Holp(s) = \frac{1}{\frac{s^2}{\omega_0^2} + \frac{s}{Q\omega_0} + 1} \tag{17}$$

where $$Hobp(s) = \frac{\frac{s}{\omega_2}}{\frac{s^2}{\omega_0^2} + \frac{s}{Q\omega_0} + 1} \tag{18}$$

Given the required $\omega_0$ and Q values, the values of $\omega_1$ and $\omega_2$ can be found by:

$$\omega_1 = \frac{\omega_0}{Q} \text{ and } \omega_2 = \omega_0 Q \tag{19}$$

Assuming equal transconductance value, the center frequency and Q of this stage are:

$$\omega_0 = \frac{G_m}{\sqrt{C_1 C_2}} \text{ and } Q = \sqrt{\frac{C_1}{C_2}} \tag{20}$$

Notice that the Q is given by the ratio of capacitors which is known to match very well. The values of the normalized center frequencies and Q's for the $6^{th}$ order Bessel filter

| $\omega_0$:BQ1 = 1.607 | $\omega_0$:BQ2 = 1.692 | $\omega_0$:BQ3 = 1.908 |
|---|---|---|
| Q = 0.510 | Q = 0.611 | Q = 1.020 |

Figure 12:
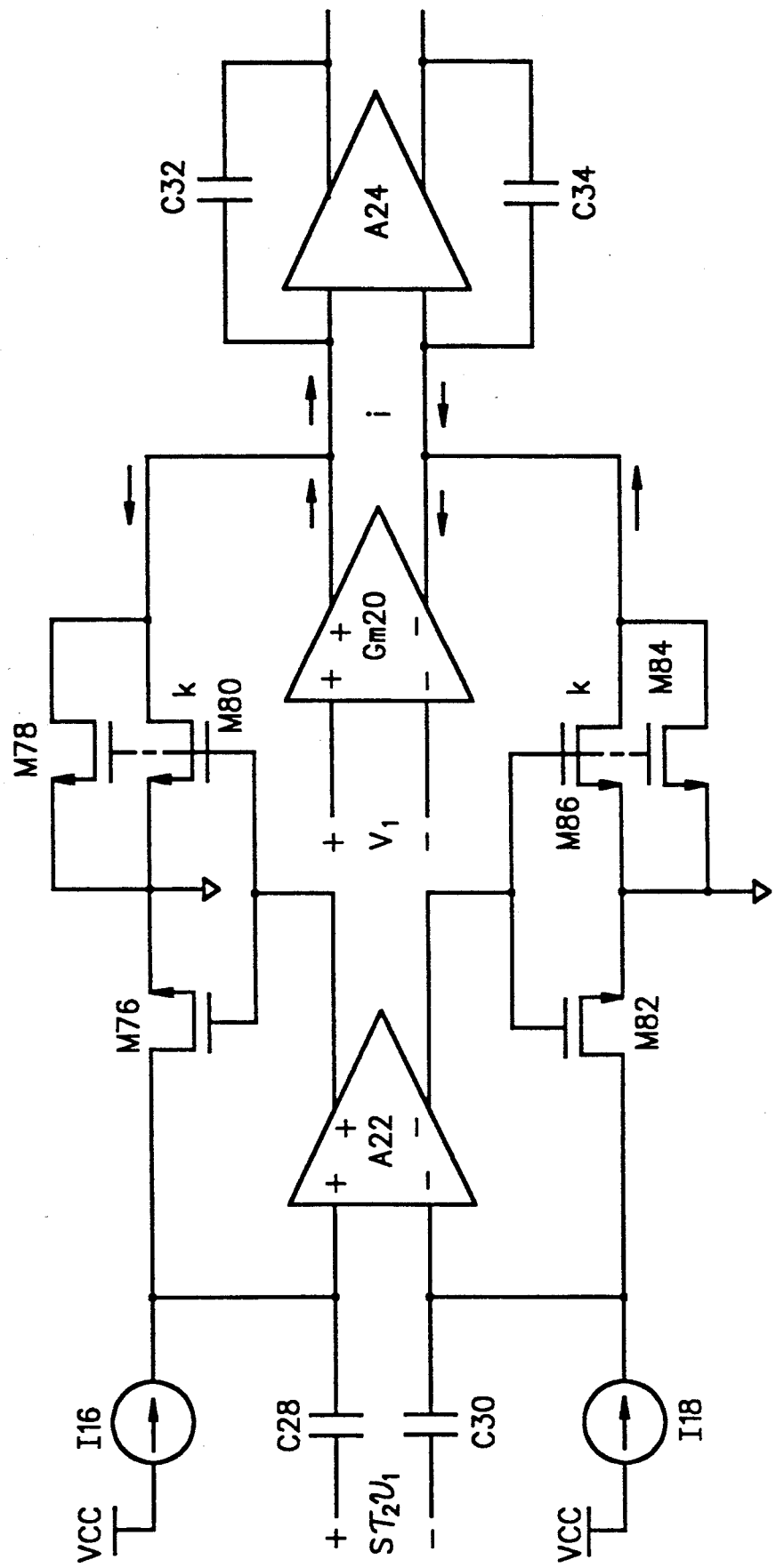
FIG. 12 shows a more detailed circuit diagram of the slimmer circuit of FIG. 10.

3. Slimmer. FIG. 12 shows the slimmer circuit (FIG. 10) of the preferred embodiment. The band pass output from FIG. 11 ($s\tau_2 v_1$) is coupled to the input of the circuit of FIG. 12. The positive input is coupled to a first terminal of a capacitor C28. A current supply I16 is coupled between the positive voltage supply vcc and the second terminal of the capacitor C28, the positive input of an amplifier A22 and the drain n-channel MOS transistor M76. Similarly, the negative input is coupled to the first terminal of a capacitor C30. A current source I18 is coupled between positive power supply vcc and the second terminal of the capacitor C30, the negative input of the amplifier A22 and the drain of an n-channel MOS transistor M82. The source of the transistor M76 is coupled to ground and to the sources of the two n-channel MOS transistors M78 and M80. The positive output of the amplifier A22 is coupled to control the gates of the three transistors M76, M78 and M80. The drains of the transistors M78 and M80 are coupled together. Note that the transistors M78 and M80 are coupled in parallel in the preferred embodiment. It is possible that these transistors could be combined into a single transistor on the integrated of the preferred embodiment sized differently and still function according to the preferred embodiment of the present invention. Similarly, the source of the transistor M82 is coupled to ground and to the sources of the two n-channel MOS transistors M84 and M86. The negative output of the amplifier A22 is coupled to control the gates of the three transistors M82, M84 and M86. The drains of the transistors M84 and M86 are coupled together. As described relative to the transistor M78 and M80, the two transistors M84 and M86 are coupled in parallel. A voltage signal V1 is coupled between the positive and negative inputs of a transconductor $G_{m20}$. The positive output of the transconductor $G_{m20}$ is coupled to the positive input of an amplifier A24 coupled as an integrator, the drains of the transistors M78 and M80 and to the first terminal of a feedback capacitor C32. The negative output of the transconductor $G_{m20}$ is coupled to the negative input of the amplifier A24, to the drains of the transistors M84 and M86 and to the first terminal of a feedback capacitor C34. The second terminal of the capacitor C32 is coupled to the positive output of the amplifier A24. The second terminal of the capacitor C34 is coupled to the negative output of the amplifier A24.

This circuit produces a high-frequency amplitude boost with flat group-delay to cancel intersymbol interference. Its high-frequency roll-off is at a high enough frequency so as to not interfere with the Bessel lowpass response. In addition, the amount of boost is digitally programmable through the serial interface under user control.

Basically, the second derivative of the signal is subtracted and amplified by a control amount from the lowpass signal path. This is done by using as an input to the circuit in FIG. 12 the bandpass output from the previous biquadratic stage, given by $s\tau_2 v_1$, which is already the first derivative of the lowpass signal, as discussed above. The circuit of FIG. 12, then, performs the second derivative of the signal voltage through the input capacitors, which have, at all times, the same value as the integrating capacitors of the second integrator from the previous biquad, independent of the corner-frequency setting. These capacitors produce a current, given by $s^2 C_1 \tau_2 v_1$, which is amplified by a current amplifier with gain k, made by transistors M78, M80, M84 and M86. The lowpass signal-current path is produced by $v_1$ driving the transconductor $g_{m20}$, into the integrating node of the next resonator. Then, the resulting current i that is integrated by the amplifier A24 of the next stage is given by:

$$i = G_m v_1 \left[ -k^2 \frac{C_1}{G_m} \tau_2 + 1 \right] \quad (21)$$

The result is that the equalizer circuit produces two real zeroes, symmetric with respect to the $j\omega$ axis whose frequency is controlled by k in such a way that an amplitude boost is realized without affecting the group-delay.

EXPERIMENTAL RESULTS

Figure 13:
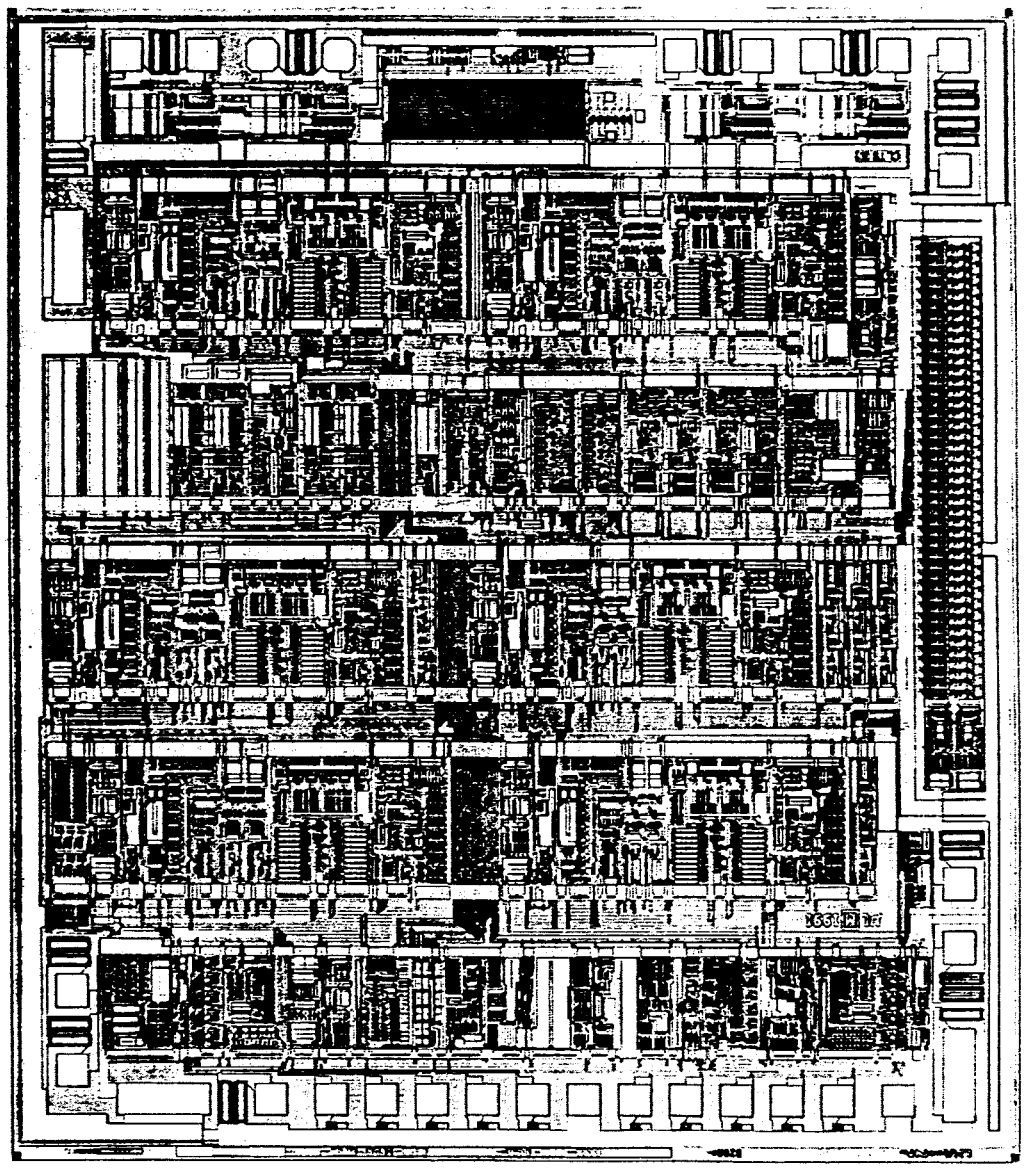
FIG. 13 shows a die photograph of the integrated circuit of the preferred embodiment.

The filter and equalizer integrated circuit described above has been integrated in a BiCMOS technology that features a 1.5μ minimum MOS channel length and NPN devices with a maximum $f_T$ of 4GHz. A die photograph of the integrated circuit of the preferred embodiment is shown in FIG. 13. The die size is 21,500 mils².

Figure 14:
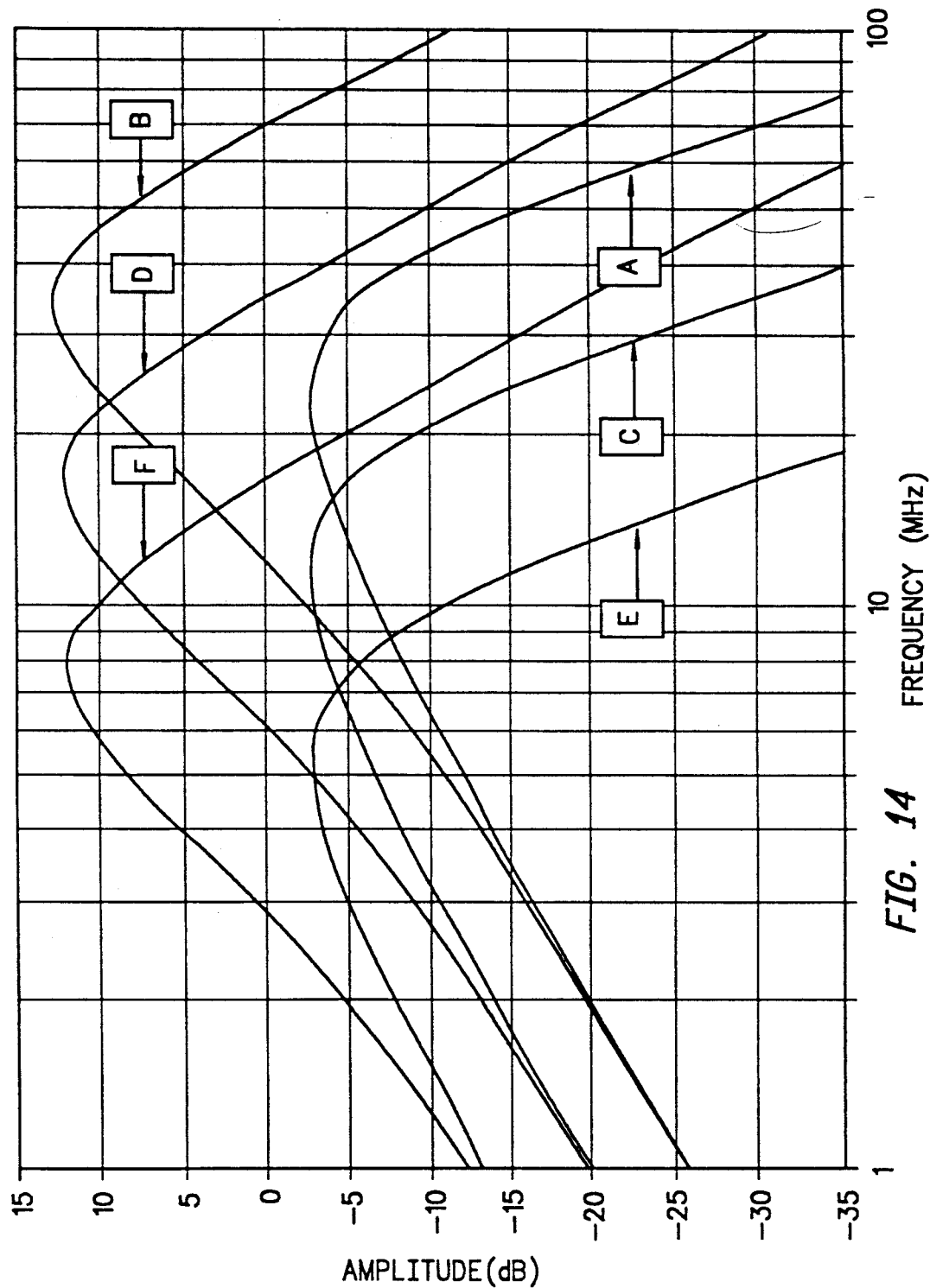
FIG. 14 shows a graph of the typical differentiated-output amplitude response of the circuit of the preferred embodiment.
Figure 15:
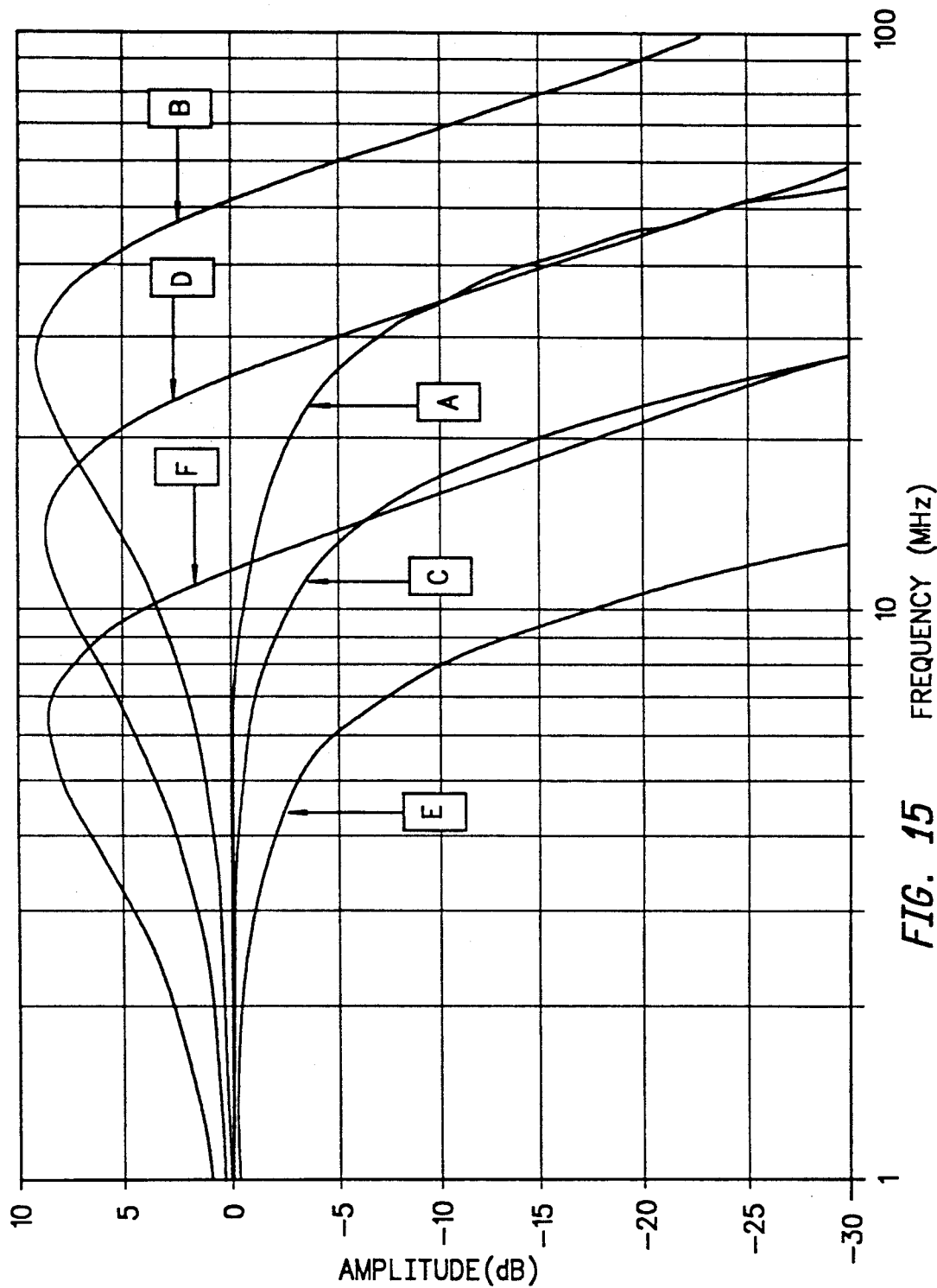
FIG. 15 shows a graph of measurements of the lowpass output amplitude of the circuit of the preferred embodiment.
Figure 16:
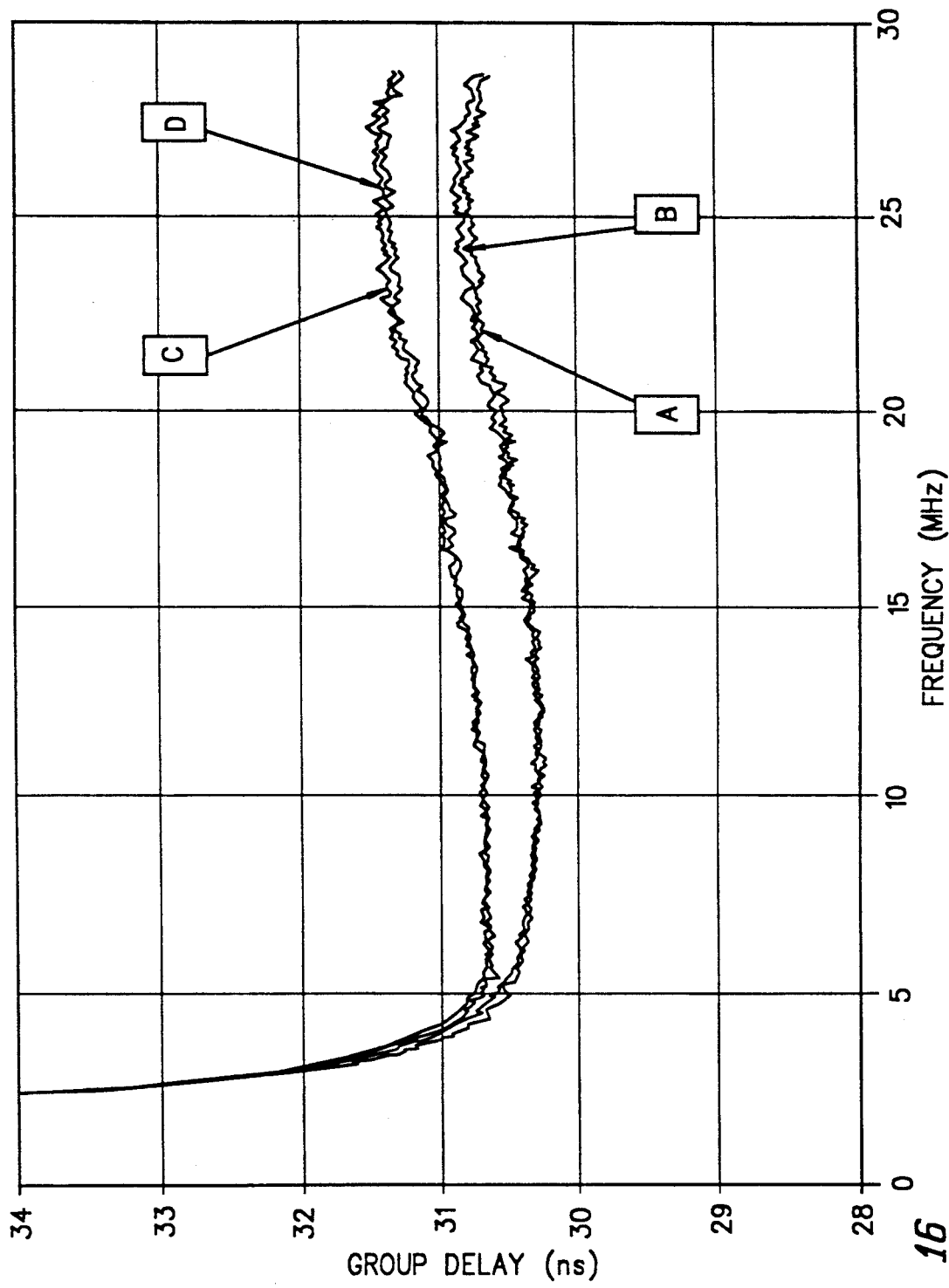
FIG. 16 shows a typical group delay responses for the lowpass and differentiated outputs of the preferred embodiment of the present invention.
Figure 17:
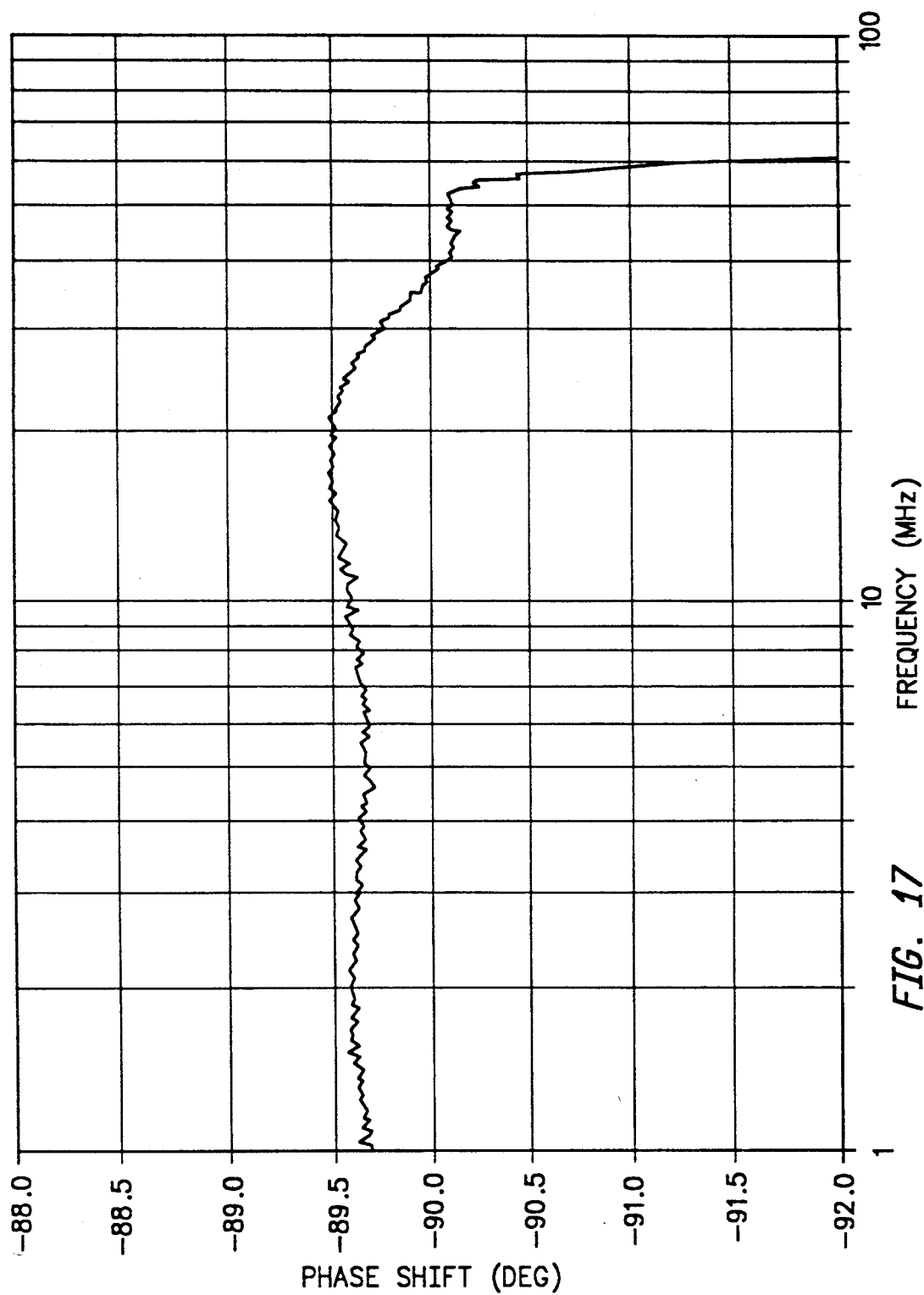
FIG. 17 shows the typical measured phase-shift between the lowpass and differentiated output for a corner frequency of 20.25 MHz without equalization.
Figure 18:
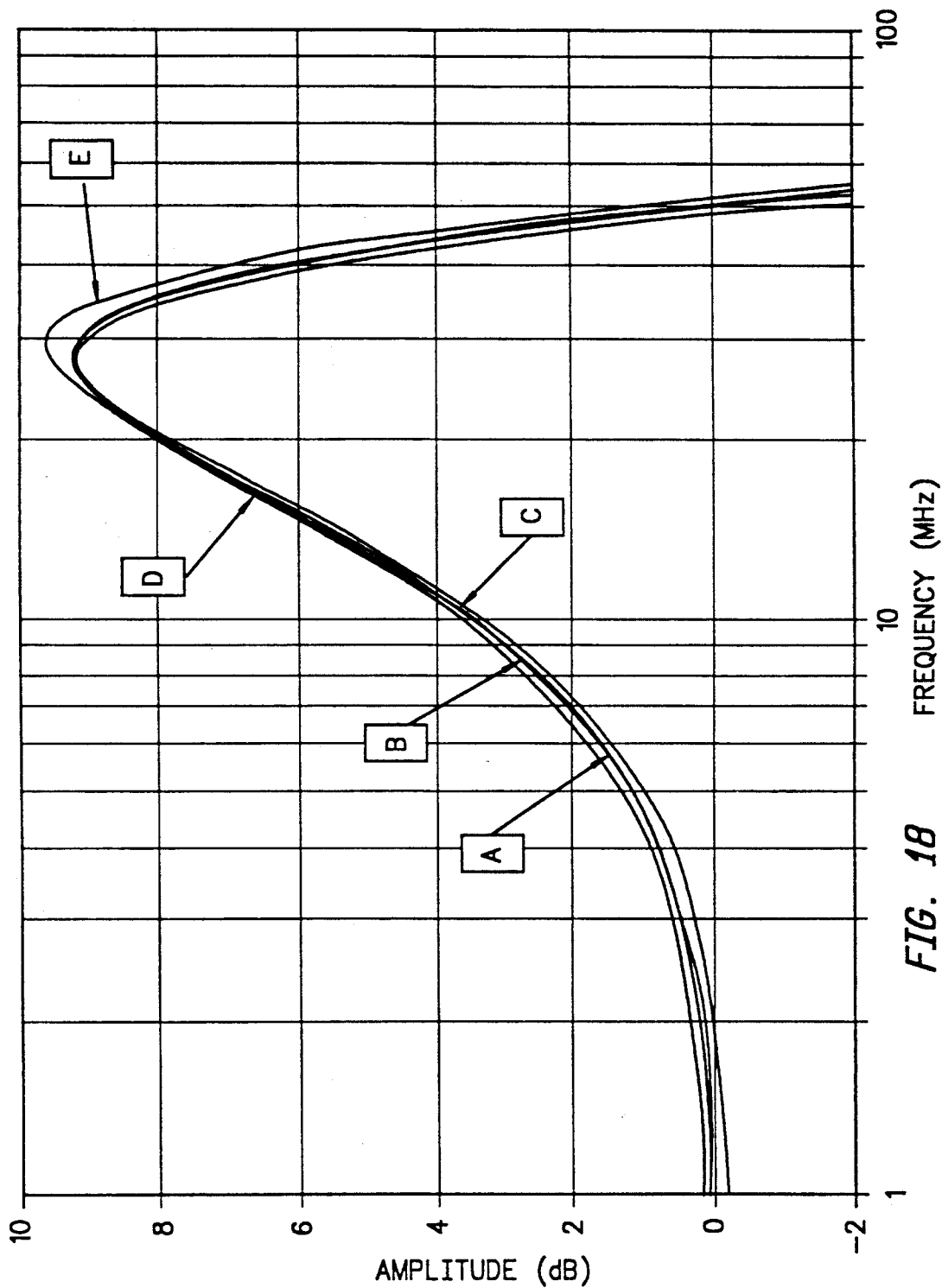
FIG. 18 shows the fully-equalized lowpass-output frequency response of the circuit of the preferred embodiment.

FIG. 14 is a graph showing the measured typical (5 v, 25° C.) lowpass-output amplitude response for three different corner-frequencies spanning the whole frequency range, curves a, c and e. Also shown is the corresponding fully-equalized response of each of those frequency-settings curves b, d and f, respectively. The slight peaking at high-frequency is due to the slimmer circuit, and shows that the excess-phase cancellation is performing properly. FIG. 15 shows the typical differentiated-output amplitude response with the same conditions as in FIG. 14. Notice the peaking at high frequency only occurring on the fully equalized curve, pointing again at the slimmer-circuit frequency response. FIG. 16 shows the typical group-delay response for the lowpass and differentiated outputs with and without equalization, and for the highest frequency setting. Notice the excellent matching between the two outputs and the negligible shift caused by equalization. This is due to the fact that no extra circuitry is used for this function since the differentiated output is readily available from this particular biquadratic structure. The higher group-delay at low-frequency is due to the AC coupling capacitors at the input and at the output of the chip. FIG. 17 shows the typical measured phase-shift between the lowpass and the differentiated output for a corner-frequency of 20.25 MHz and no equalization. Notice that in this particular device, the excess-phase of the second integrator of the last biquad has not been optimally trimmed. However, the integrator maintains an almost constant $-90°$ phase-shift to within $\pm 0.5°$, even up to 50MHz. FIG. 18 shows the fully-equalized 20.25 MHz lowpass output frequency response. measured across temperature (0°, 25° C. and 70° C.) and supply (4.5 V., 5.0 V. and 5.5 V.). Notice the extremely small deviation across supplies (Curves a, b and c) due to the ground-referred biasing scheme employed in this chip. The other two are the temperature response curves which also point to a very small deviation from the typical case. This shows that the excess-phase cancellation and the bandwidth setting circuit are functioning properly. Table I summarizes the typical performance of the filter and equalizer IC. Notice that the cutoff-frequency and the equalization accuracy is maintained across temperature and supply variations.

| TYPICAL PERFORMANCE (+5 V, 25° C.) | |
|---|---|
| Filter Cutoff Frequency | 4.7 MHz to 20.3 MHz |
| Accuracy | ±5% |
| Equalization Range | 0 to 10 dB |
| Accuracy | ±0.5 dB |
| THD with 2 Vp − p | 0.24% |
| Noise (BW = 100 MHz; Rs = 50Ω) | 2.0 mVRMS |
| Power Supply | +5 V ± 10% |
| Temperature Range | 0 -70° C. |
| Power Dissipation | 350 mW |
| Power down | 7.5 mW |
| Technology | 1.5μ/4 GHz BiCMOS |

The design of a fast parasitic-insensitive continuous-time filter that uses an active integrator has been described. In particular, circuit techniques for excess-phase cancellation and setting of corner frequency have been presented. This is done without employing phase-lock loops, resulting in no clock feedthrough, amplitude jitter, or power-up time limitations. These techniques allow a process, supply and temperature independent performance that enhances yield and manufacturability. The highest achievable cutoff frequency for the filter presented here is not bounded principally by the matching properties of the technology over temperature and supply variations.

We claim:

1. A slimmer circuit for narrowing data pulses comprising:
   a. means for receiving a voltage signal having a characteristic;
   b. a circuit for forming a bandpass response signal for the voltage signal;
   c. a circuit for forming a lowpass response signal for the voltage signal;
   d. means for forming a second derivative of the bandpass response signal for forming a second derivative signal;
   e. means for amplifying the second derivative signal for forming an amplified signal; and
   f. means for subtracting the amplified signal from the lowpass response signal for forming a difference signal.

2. The slimmer circuit according to claim 1 wherein the difference signal comprises a second-order approximation of a cosine equalizer.

3. The slimmer circuit according to claim 1 wherein the circuit includes five bit means for controlling the slimmer circuit for providing 32 slimming levels.

4. The slimmer circuit according to claim 1 wherein the means for forming a second derivative comprises an input capacitor.

5. The slimmer circuit according to claim 1 wherein the lowpass response signal comprises a transfer function according to the equation:

$$Holp(s) = \frac{1}{\frac{s^2}{\omega_0^2} + \frac{s}{Q\omega_0} + 1}$$

where Q is a quality factor and $\omega_0$ is function of a transconductance of the circuit for forming the lowpass response signal.

6. The slimmer circuit according to claim 1 wherein the bandpass response signal comprises a transfer function according to the equation:

$$Hobp(s) = \frac{\frac{s}{\omega_2}}{\frac{s^2}{\omega_0^2} + \frac{s}{Q\omega_0} + 1}$$

where Q is a quality factor and $\omega_0$ is function of a transconductance of the circuit for forming the lowpass response signal and $\omega_2 = \omega_0 Q$ is the bandwidth of the second integrator. (FIG. 11)

7. A slimmer circuit for narrowing data pulses comprising:
   a. a differential amplifier having a positive input, a negative input, a positive output and a negative output;
   b. a first capacitor having a first terminal coupled to the positive input;
   c. a first current source coupled to the positive input;
   d. a second capacitor having a first terminal coupled to the negative input;
   e. a second current source coupled to the negative input;
   f. a first voltage signal coupled to a second terminal of the first capacitor and to a second terminal of the second capacitor;
   g. a first and a second n-channel MOS transistor having a gate coupled to the positive output of the amplifier and a source coupled to a circuit ground;
   h. a drain of the first transistor coupled to the positive input of the amplifier;
   i. a third and a fourth n-channel MOS transistor having a gate coupled to the negative output of the amplifier and a source coupled to a circuit ground;
   j. a drain of the third transistor coupled to the negative input of the amplifier;
   k. a differential transconductor having a positive input, a negative input, a positive output and a negative output;
   l. a second voltage signal coupled to the positive input and the negative input of the transconductor;
   m. a drain of the second transistor coupled to the positive output of the transconductor; and
   n. a drain of the fourth transistor coupled to the negative output of the transconductor.

8. The slimmer circuit according to claim 7 wherein an output of the slimmer circuit comprises a second-order approximation of a cosine equalizer.

9. The slimmer circuit according to claim 7 wherein the circuit includes five bit means for controlling the slimmer circuit for providing 32 slimming levels.

10. The slimmer circuit according to claim 9 wherein the first voltage signal comprises a transfer function according to the equation:

$$Holp(s) = \frac{1}{\frac{s^2}{\omega_0^2} + \frac{s}{Q\omega_0} + 1}$$

where Q is a quality factor and $\omega_0$ is function of a transconductance of the circuit for forming the lowpass response signal.

11. The slimmer circuit according to claim 9 wherein the second voltage signal comprises a transfer function according to the equation:

$$Hobp(s) = \frac{\frac{s}{\omega_2}}{\frac{s^2}{\omega_0^2} + \frac{s}{Q\omega_0} + 1}$$

where Q is a quality factor and $\omega_0$ is function of a transconductance of the circuit for forming the lowpass response signal.

* * * * *

UNITED STATES PATENT AND TRADEMARK OFFICE
CERTIFICATE OF CORRECTION

PATENT NO. : 5,283,483
DATED : February 1, 1994
INVENTOR(S) : LABER ET AL.

It is certified that error appears in the above-identified patent and that said Letters Patent is hereby corrected as shown below:

In col. 4, line 53: in two instances, please replace "110" with --I10--.

In col. 6, line 13: please replace "vo." with --vo---.

In col. 6, line 44: please replace "$C_{m16}$" with --$G_{m16}$--.

In col. 6, line 47: please replace "$C_{m16}$" with --$G_{m16}$--.

In col. 6, line 51: please replace "$C_{m14}$" with --$G_{m14}$--.

In col. 6, line 63: please replace "$C_{m16}$" with --$G_{m16}$--.

In col. 7, line 13: please replace "vi-" with --vi+--.

In col. 7, line 51: please replace "non dominant" with --non-dominant--.

In col. 7, line 67: please replace "n channel" with --n-channel--.

In col. 9, line 11: please replace "ThiS" with --This--.

In col. 9, line 29: please replace "n channel" with --n-channel--.

In col. 9, line 47: please replace "vo." with --vo---.

UNITED STATES PATENT AND TRADEMARK OFFICE
CERTIFICATE OF CORRECTION

PATENT NO. : 5,283,483
DATED : February 1, 1994
INVENTOR(S) : LABER ET AL.

It is certified that error appears in the above-identified patent and that said Letters Patent is hereby corrected as shown below:

In col. 10, lines 52-53: please replace "exces-s-phase" with --excess-phase--.

In col. 11, line 44: please replace "112" with --I12--.

In col. 11, line 47: please replace "112" with --I12--.

In col. 11, line 58: please replace "114" with --I14--.

In col. 11, line 68: please replace "114" with --I14--.

In col. 12, line 10: please replace "114" with --I14--.

In col. 13, line 54: please replace "vin." with --vin---.

In col. 13, line 68: please replace "volp." with --volp---.

In col. 14, line 15: please replace "where" with --and--.

In col. 14, line 39: please insert "are:" after --filter--.

In col. 16, line 32: please replace "lowpass output frequency response." with --lowpass-output frequency response,"--.

UNITED STATES PATENT AND TRADEMARK OFFICE
CERTIFICATE OF CORRECTION

PATENT NO. : 5,283,483
DATED : February 1, 1994
INVENTOR(S) : Laber, et al

It is certified that error appears in the above-indentified patent and that said Letters Patent is hereby corrected as shown below:

In col. 16, lines 61-62: pleae replace "exces-s-phase with --excess-phase--.

Signed and Sealed this

Twenty-sixth Day of July, 1994

Attest:

BRUCE LEHMAN

*Attesting Officer*    *Commissioner of Patents and Trademarks*